US006381707B1

(12) United States Patent
Larsen et al.

(10) Patent No.: US 6,381,707 B1
(45) Date of Patent: Apr. 30, 2002

(54) SYSTEM FOR DECODING ADDRESSES FOR A DEFECTIVE MEMORY ARRAY

(75) Inventors: Corey Larsen, Marsing; Richard Weber, Boise, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/067,347

(22) Filed: Apr. 28, 1998

(51) Int. Cl.[7] ............................................... G06F 11/00

(52) U.S. Cl. ...................................................... 714/8

(58) Field of Search ........................... 714/5, 8, 54, 42

(56) References Cited

U.S. PATENT DOCUMENTS

| 3,444,526 A | * | 5/1969 | Fletcher ........................ 714/42 |
| 3,681,757 A | * | 8/1972 | Allen ........................... 712/300 |
| 3,714,637 A | | 1/1973 | Beausoleil ............... 340/173 R |
| 3,715,735 A | | 2/1973 | Moss ....................... 340/173 R |
| 3,735,368 A | | 5/1973 | Beausoleil ............... 340/173 R |
| 3,772,652 A | | 11/1973 | Hilberg .................... 340/172.5 |
| 3,781,826 A | * | 12/1973 | Beausoleil ................... 365/200 |
| 5,781,826 A | | 12/1973 | Beausoleil ............... 340/173 R |
| 3,800,294 A | | 3/1974 | Lawlor .................... 340/172.5 |
| 3,845,476 A | | 10/1974 | Boehm ................ 340/173 BB |
| 4,355,376 A | | 10/1982 | Gould ......................... 365/200 |
| 4,376,300 A | | 3/1983 | Tsang ......................... 365/200 |
| 4,404,647 A | * | 9/1983 | Jones ............................. 714/5 |
| 4,450,560 A | | 5/1984 | Conner ........................ 371/25 |
| 4,475,194 A | | 10/1984 | LaVallee et al. ............... 371/10 |
| 4,479,214 A | | 10/1984 | Ryan ........................... 371/11 |
| 4,493,075 A | | 1/1985 | Anderson et al. ............. 371/10 |
| 4,527,251 A | | 7/1985 | Nobby, Jr. et al. .......... 364/900 |
| 4,646,299 A | | 2/1987 | Schinabeck et al. .......... 371/20 |
| 4,807,191 A | | 2/1989 | Flannagan .................. 365/189 |
| 4,837,747 A | | 6/1989 | Dosaka et al. ................. 371/10 |
| 4,876,685 A | | 10/1989 | Rich .......................... 371/21.6 |
| 4,881,200 A | | 11/1989 | Urai ....................... 365/189.04 |
| 4,908,798 A | | 3/1990 | Urai ....................... 365/230.03 |
| 4,918,662 A | | 4/1990 | Kondo ........................ 365/210 |
| 4,935,899 A | | 6/1990 | Morigami .................... 365/200 |
| 4,992,984 A | | 2/1991 | Busch et al. ................. 365/200 |
| 5,051,994 A | | 9/1991 | Bluethman et al. ......... 371/11.1 |
| 5,060,197 A | | 10/1991 | Park et al. ................... 365/200 |
| 5,124,948 A | | 6/1992 | Takizawa et al ............ 365/200 |
| 5,126,973 A | | 6/1992 | Gallia et al. ................. 365/200 |
| 5,134,584 A | | 7/1992 | Boler et al. .................. 365/200 |
| 5,200,959 A | | 4/1993 | Gross et al. ................ 371/21.6 |
| 5,208,775 A | | 5/1993 | Lee .............................. 365/200 |
| 5,233,614 A | | 8/1993 | Singh ......................... 371/21.6 |
| 5,243,570 A | | 9/1993 | Saruwatari ................... 365/201 |
| 5,251,174 A | | 10/1993 | Hwang ........................ 365/200 |
| 5,268,866 A | | 12/1993 | Feng et al. ................... 365/200 |
| 5,270,974 A | | 12/1993 | Reddy ......................... 365/200 |

(List continued on next page.)

OTHER PUBLICATIONS

Intel, PC SDRAM Specification, Revision 1.63, pp. i–54, Oct. 1998.
Intel, PC SDRAM Unbuffered DIMM Specification, Revision 1.0, pp. 1–47, Feb. 1998.
Shanley, T. and D. Anderson, ISA Sustem Architecture, third Edition, pp. 126–132, 221–232, 1995, Copyright 1995 by MindShare, Inc.
Micron Electronics, Inc. –Assignee, U.S. App. S/N 09/035, 629, Filed Mar. 5, 1998, "Recover of Partially Defective Synchronous Memory Components."

(List continued on next page.)

Primary Examiner—Robert Beausoleil
Assistant Examiner—Bryce P. Bonzo
(74) Attorney, Agent, or Firm—Knobbe Martens Olson & Bear LLP

(57) ABSTRACT

The use of a partially defective memory array to create a non-defective memory array. In a manner transparent to the memory controller, an address decoder is used to make a large memory array look like a smaller, non-defective memory array.

34 Claims, 13 Drawing Sheets

U.S. PATENT DOCUMENTS

| | | | |
|---|---|---|---|
| 5,270,976 A | 12/1993 | Tran | 365/200 |
| 5,315,552 A | 5/1994 | Yoneda | 365/200 |
| 5,327,380 A | 7/1994 | Kersh, III et al. | 365/195 |
| 5,331,188 A | 7/1994 | Acovic et al. | 257/298 |
| 5,332,922 A | 7/1994 | Oguchi et al. | 257/723 |
| 5,337,277 A | 8/1994 | Jang | 365/200 |
| 5,349,556 A | 9/1994 | Lee | 365/200 |
| 5,371,866 A | 12/1994 | Cady | 395/400 |
| 5,379,415 A | 1/1995 | Papenberg et al. | 395/575 |
| 5,390,129 A | 2/1995 | Rhodes | 364/480 |
| 5,392,247 A | 2/1995 | Fujita | 365/200 |
| 5,400,263 A | 3/1995 | Rohrbaugh et al. | 364/490 |
| 5,400,342 A | 3/1995 | Matsumura et al. | 371/21.2 |
| 5,406,565 A | 4/1995 | MacDonald | 371/10.3 |
| 5,410,545 A | 4/1995 | Porter et al. | 371/21.6 |
| 5,424,989 A | 6/1995 | Hagiwara et al. | 365/201 |
| 5,434,792 A | 7/1995 | Saka et al. | 364/468 |
| 5,465,234 A | 11/1995 | Hannai | 365/200 |
| 5,469,390 A | 11/1995 | Sasaki et al. | 365/200 |
| 5,475,648 A | 12/1995 | Fujiwara | 365/230.06 |
| 5,475,695 A | 12/1995 | Caywood et al. | 371/27 |
| 5,491,664 A | 2/1996 | Phelan | 365/200 |
| 5,497,381 A | 3/1996 | O'Donoghue et al. | 371/28 |
| 5,502,333 A | 3/1996 | Berin et al. | 257/685 |
| 5,513,135 A | 4/1996 | Dell et al. | 365/52 |
| 5,513,327 A | 4/1996 | Farmwald et al. | 395/309 |
| 5,528,553 A | 6/1996 | Saxena | 365/230.01 |
| 5,535,328 A | 7/1996 | Harari et al. | 395/182.06 |
| 5,538,115 A | 7/1996 | Koch | 188/299 |
| 5,539,697 A | 7/1996 | Kim et al. | 365/200 |
| 5,544,106 A | 8/1996 | Koike | 365/200 |
| 5,548,553 A | 8/1996 | Cooper et al. | 365/200 |
| 5,553,231 A | 9/1996 | Papenberg et al. | 395/182.03 |
| 5,576,999 A | 11/1996 | Kim et al. | 365/200 |
| 5,588,115 A | 12/1996 | Augarten | 395/183.05 |
| 5,600,258 A | 2/1997 | Graham et al. | 34/758 |
| 5,602,987 A | 2/1997 | Harari et al. | 395/182.06 |
| 5,631,868 A | 5/1997 | Termullo, Jr. et al. | 365/200 |
| 5,633,826 A | 5/1997 | Tsukada | 365/200 |
| 5,636,173 A | 6/1997 | Schaefer | 365/230.03 |
| 5,654,204 A | 8/1997 | Anderson | 438/15 |
| 5,668,763 A | 9/1997 | Fujoka et al. | 365/200 |
| 5,717,694 A | 2/1998 | Ohsawa | 371/5.1 |
| 5,734,621 A | 3/1998 | Ito | 365/230.03 |
| 5,745,673 A | 4/1998 | Di Zenzo et al. | 395/182.05 |
| 5,754,753 A | 5/1998 | Smelser | 395/182.06 |
| 5,758,056 A | 5/1998 | Barr | 395/182.05 |
| 5,768,173 A | 6/1998 | Seo et al. | 365/52 |
| 5,798,962 A | 8/1998 | Di Zenzo et al. | 365/52 |
| 5,841,710 A | 11/1998 | Larsen et al. | 365/200 |
| 5,862,314 A | 1/1999 | Jeddeloh | 395/182.06 |
| 5,896,346 A | 4/1999 | Dell et al. | 365/233 |
| 5,913,020 A | 6/1999 | Rohwer | 395/182.06 |
| 5,920,512 A | 7/1999 | Larsen | 365/200 |
| 5,920,513 A | 7/1999 | Jacobson | 365/200 |
| 5,956,233 A | 9/1999 | Yew et al. | 361/760 |
| 5,963,463 A | 10/1999 | Rondeau, II et al. | 365/52 |
| 5,966,724 A | 10/1999 | Ryan | 711/105 |
| 5,970,008 A | 10/1999 | Zagar et al. | 365/226 |
| 5,974,564 A | 10/1999 | Jeddeloh | 714/8 |
| 5,991,215 A | 11/1999 | Bunelle | 365/201 |
| 5,995,409 A | 11/1999 | Holland | 365/149 |
| 5,996,096 A | 11/1999 | Dell et al. | 714/710 |
| 6,009,536 A | 12/1999 | Rohwer | 714/8 |
| 6,115,828 A * | 9/2000 | Tsutsumi | 714/7 |
| 6,192,486 B1 * | 2/2001 | Correale | 714/8 |
| 6,192,487 B1 * | 2/2001 | Douceur | 714/8 |

OTHER PUBLICATIONS

Micron Electronics, Inc.–Assignee, U. S. App. S/N 08/903, 819, Filed Jul. 31, 1997, "System for Remapping Defective Memory Bits Sets."

Micron Electronics, Inc. –Assignee, U. S. App. S/N 09/217, 781, Filed Dec. 21, 1998, "Use of Partially Dysfunctional Memory Devices."

Micron Electronics, Inc. –Assignee, U.S. App. S/N 08/903, 819, Filed Jul. 31, 1997, "System for Remapping Defective Memory Bits Sets."

Micron Electronics, Inc. –Assignee, U.S. App. S/N 09/519, 641, Filed Mar. 6, 2000,"Method and Apparatus for Recovery of Useful Areas of Partially Defective Rambus RIMM Components."

Micron Electronics, Inc. –Assignee, U.S. App. S/N 09/548, 826, Filed Apr. 13, 2000. "Method and Apparatus for Storing Falling Part Locations in a Module."

Micron Electronics, Inc. –Assignee, U.S. App. S/N 09/217, 781, filed Dec. 21, 1998. "Use of Partially Dysfunctional Memory Devices."

Micron Electronics, Inc. –Assignee, U.S. App. S/N 09/035629, Filed Mar. 5, 1998, "Recovery of Partially Defective Synchronous Memory Components."

Micron Electronics, Inc. –Assignee, U.S. App. S/N 09/035, 739, Filed Aug.3, 2000, "Method for Recovery of Useful Areas of Partially Defective Synchronous Memory Components."

* cited by examiner

SYSTEM FOR DECODING ADDRESSES FOR A DEFECTIVE MEMORY ARRAY

RELATED APPLICATIONS

This application is related to U.S. patent application Ser. No. 09/067,467, entitled "METHOD FOR DECODING ADDRESSES FOR A DEFECTIVE MEMORY ARRAY," filed on Apr. 28, 1998.

FIELD OF THE INVENTION

The present invention relates generally to the use of partially defective memory chips or memory arrays. More particularly, the present invention relates to the use of a partially defective memory array to create a non-defective memory array.

BACKGROUND AND SUMMARY OF THE DISCLOSURE

As is well known in the art, during the production of monolithic memory devices from silicon wafers, memory storage cells can become defective and unreliable. These defective cells can be the result of a number of causes, such as impurities introduced in the process of manufacturing the monolithic memory device from the silicon wafer, or localized imperfections in the silicon substrate itself.

Often, while some memory cells in a particular memory array are defective, many other cells on the same memory array are not defective, and will work reliably and accurately. In addition, it is often the case that the defective cells are localized and confined to particular regions within the memory array. The remaining, non-defective regions, however, can be relied upon to provide a consistent and accurate representation of the information in the storage cell. What is needed, therefore, is a system or method for salvaging non-defective portions of memory arrays, even where the non-defective portions are not localized to any particular outputs on the memory module or memory array. Such a system preferably works transparently to the memory controller and is compatible with existing systems.

SUMMARY OF INVENTION

The present invention relates to techniques for salvaging non-defective portions of a memory array or memory module. In one embodiment of the invention, the invention relates to a computer comprising: (a) a processor; (b) a memory controller connected to the processor by a host bus, wherein the memory controller generates an address; (c) a memory module that is accessible to the memory controller through an address bus, wherein the memory module includes a defective portion and a non-defective portion; and (d) a decoder. The decoder comprises inputs that receive at least a portion of the address from the memory controller, logic that modifies the address so that the defective portion of the memory module is not accessed, and logic that places at least a portion of the modified address on the address bus.

In another embodiment of the present invention, the present invention relates to a memory controller that accesses a memory module over an address bus, wherein the memory module has a defective portion and a non-defective portion. The memory controller comprises: (a) inputs for receiving an address from a processor over a host bus; (b) address outputs connected to the address bus; (c) logic that modifies the address received from the processor so that the defective portion of the memory module is not accessed; and (d) logic that places the modified address at the address outputs.

Additional embodiments and features, and the nature of the present invention may be more clearly understood by reference to the following detailed description of the invention, the appended claims, and to the several drawings herein.

Additional embodiments and features, and the nature of the present invention may be more clearly understood by reference to the following detailed description of the invention, the appended claims, and to the several drawings herein.

DETAILED DESCRIPTION

Figure 1:
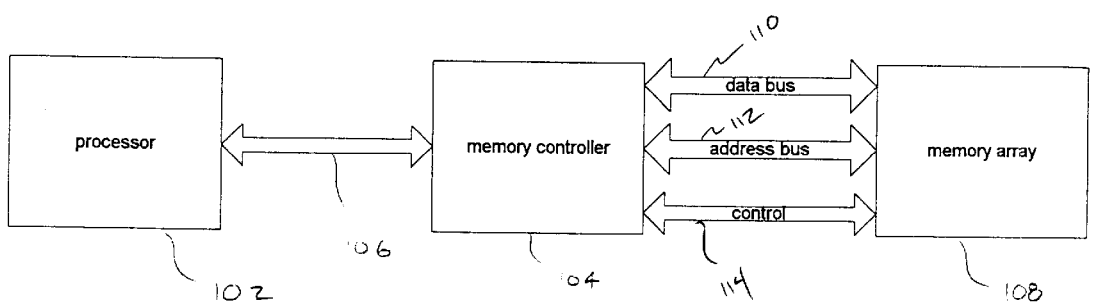
FIG. 1 is a block diagram of a computer system having a processor and a memory array that are connected through a memory controller.

FIG. 1 is a block diagram of a computer system comprising a microprocessor 102, a memory controller 104, and a host bus 106. The memory controller interfaces a memory array 108 to the processor 102. The memory controller 104 communicates with the memory array 108 over a data bus 110 and an address bus 112. Control signals are also communicated between the memory controller 104 and the memory array 108 over the connection 114.

Figure 2:
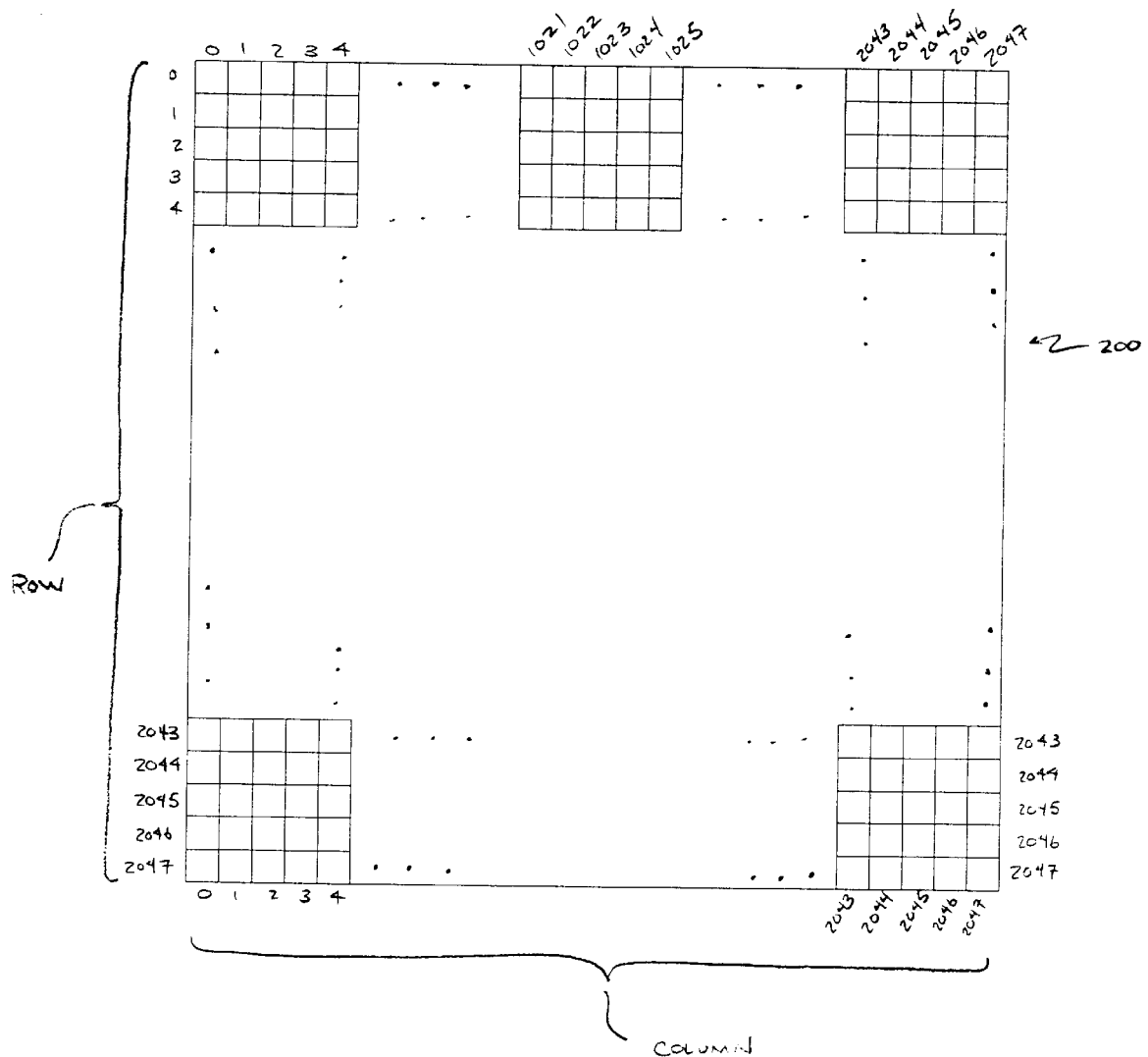
FIG. 2 is a representation of a 2048×2048 memory array.
Figure 3:
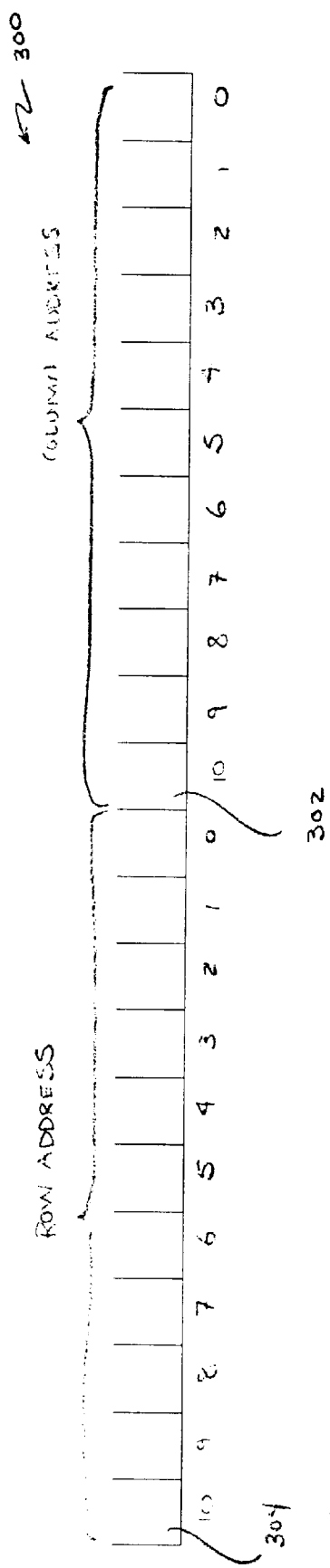
FIG. 3 is a representation of a memory address, having a row address portion and a column address portion.

FIG. 2 is a representation of a 2048×2048 memory array 200 having $2^{22}$ (4 Meg.) memory cells in the array. FIG. 3 shows a bit diagram of the address used to address a particular cell in the array 200. Addressing a particular cell within the array involves generating an eleven bit row address, which forms a portion of the complete address shown in FIG. 3. The row portion of the address selects one of the 2048 horizontal rows in the array 200. An eleven bit column address, also shown in FIG. 3, addresses one of the 2048 vertical columns shown in FIG. 2. The row and column addresses are typically presented to the memory array or memory module in a multiplexed fashion, with the row address preceding the column address. Together, the row and column address select exactly one particular cell in the array, thereby effectively addressing a desired memory location.

Although the memory array 200 shown in FIG. 2 represents one bank of memory, it should be understood that memory arrays often have more than one bank of memory. For simplicity, the present invention is described principally in terms of a memory array having a single bank of memory, but it should be understood that the present invention could be implemented with memory arrays or systems having more than one bank of memory.

Figure 4:
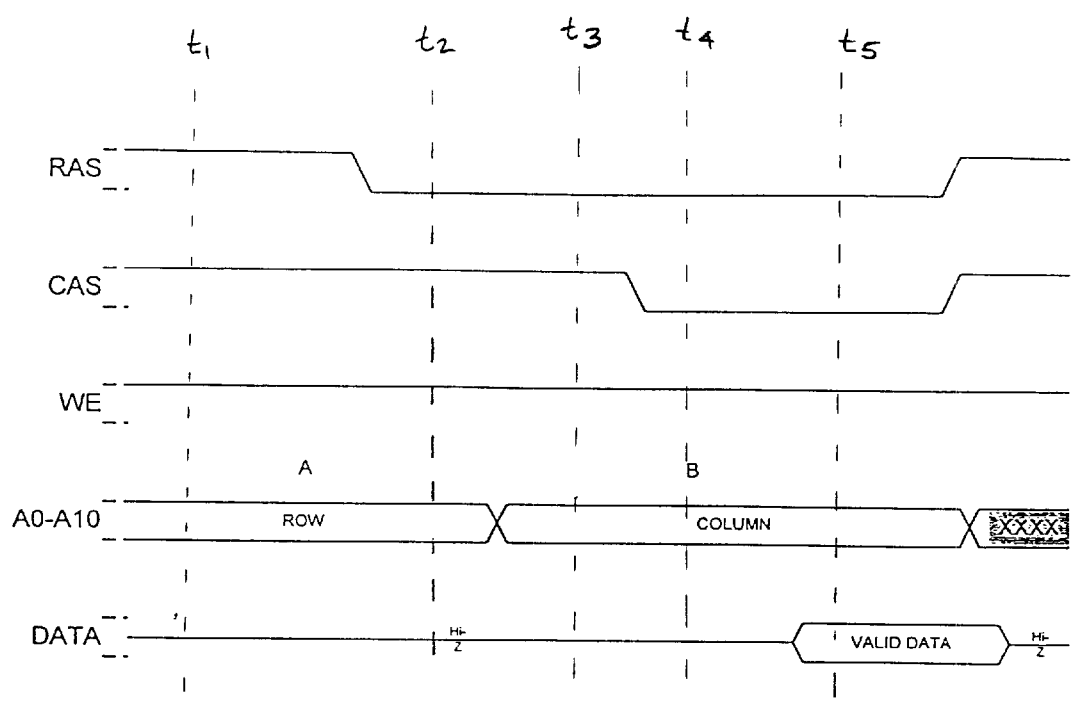
FIG. 4 is a timing diagram illustrating a memory read cycle in a system using a multiplexed address.

FIG. 4 is a timing diagram illustrating the operation of a read cycle for a memory array using multiplexed memory addressing. Since the row and column addresses are presented in a consecutive fashion, rather than at the same time, only eleven address lines (e.g., A0 to A10) are needed to present the address to the memory array, and these lines are used for both the row and column addresses. The eleven bit row address is first presented to the memory array over lines A0 to A10, and then the eleven bit column address is presented to the memory array over the same lines A0 to A10 after the row address is removed.

At time t1 in FIG. 4, the row address has been placed on the address lines A0 to A10, and by time t2, the active-low row address strobe (RAS) control signal is asserted to strobe the address lines to the memory array. At time t3, the row address has been removed from the address lines A0 to A10, and the column address is placed on these same lines A0 to A10. By time t4, the column address strobe (CAS), which is also active-low, has been asserted, and the data from the memory array becomes available thereafter at time t5. The row address strobe in the timing diagram of FIG. 4 continues to be asserted during the times t4 and t5 to allow the column address to be toggled in a burst mode or fast-paging mode. And since the operation illustrated in FIG. 4 is a read operation, the (active-low) write enable (WE) control line is inactive throughout the cycle.

Figure 5:
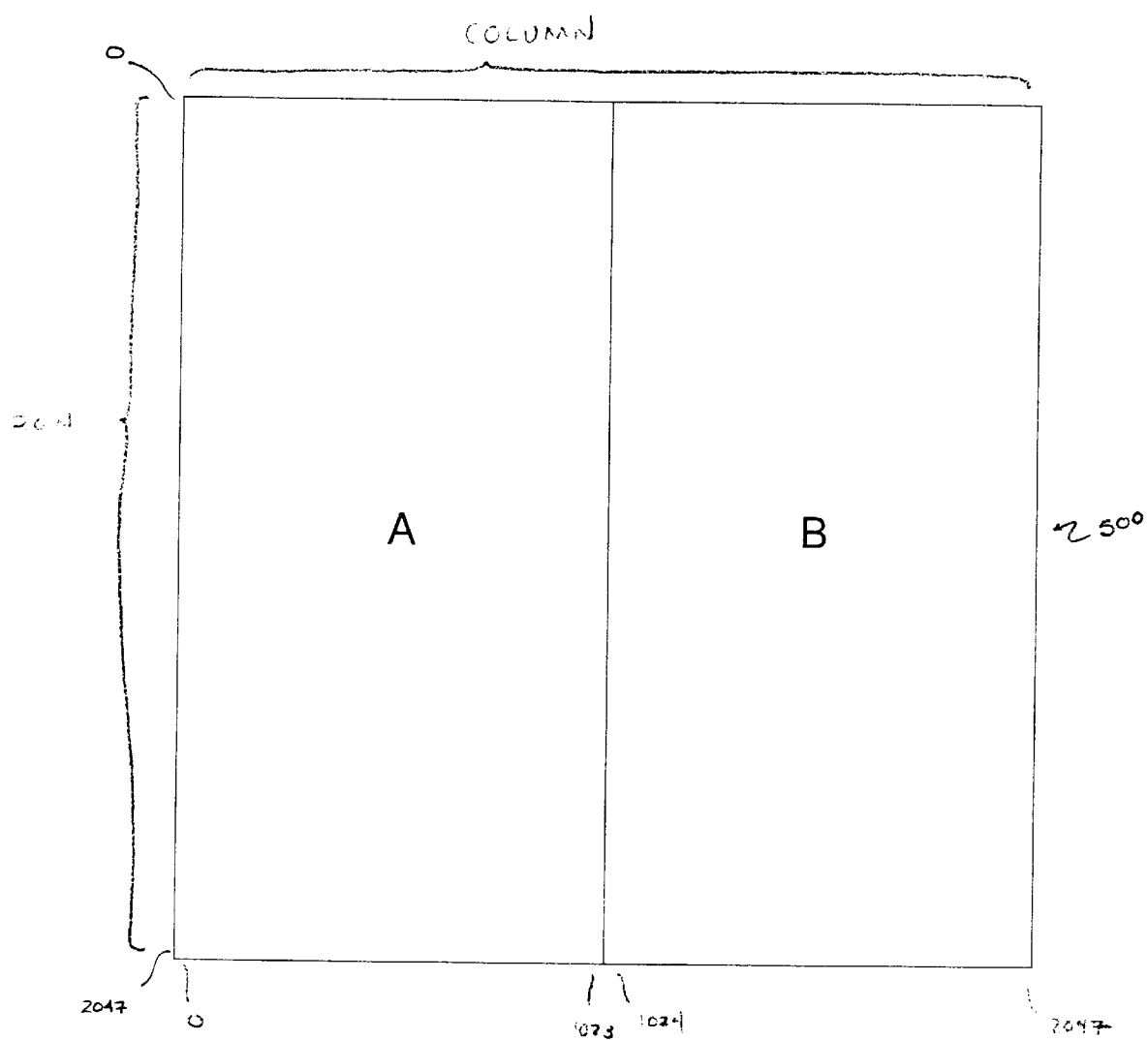
FIG. 5 is a representation of a memory array having a defective portion and a non-defective portion divided at a column address boundary.

FIG. 5 is a representation of a memory array 500 of size 2048×2048. As with the array 200 shown in FIG. 2, individual memory locations within the array are addressed using a row and column address. In the array shown in FIG. 5, the cells within region A in the memory array (columns 0 to 1023 for all rows) are not defective, and provide reliable data. However, at least some of the memory cells within region B (columns 1024 to 2047 for all rows) are defective, and cannot be relied upon for valid and accurate data. Thus, at least some of the cells within region B in FIG. 5 are unusable.

The unusable cells within region B fall on one side of a column address boundary. When a higher order bit, and in this case the most significant column address bit, is high (see bit 302 in FIG. 3), the addressed memory cell falls within region B of FIG. 5, but when the most significant column address bit is low, the addressed memory cell falls within region A of FIG. 5. Thus, for the memory map of FIG. 5, the state of the most significant column address bit determines whether the addressed memory cell is within region A or region B. Thus, Region A in the device represented by the map of FIG. 5 can be effectively addressed with an eleven bit row address and a ten bit column address. In other words, by using an eleven bit row address, and a ten bit column address and one additional bit that is forced low, only addresses within Region A will be addressed.

Figure 6:
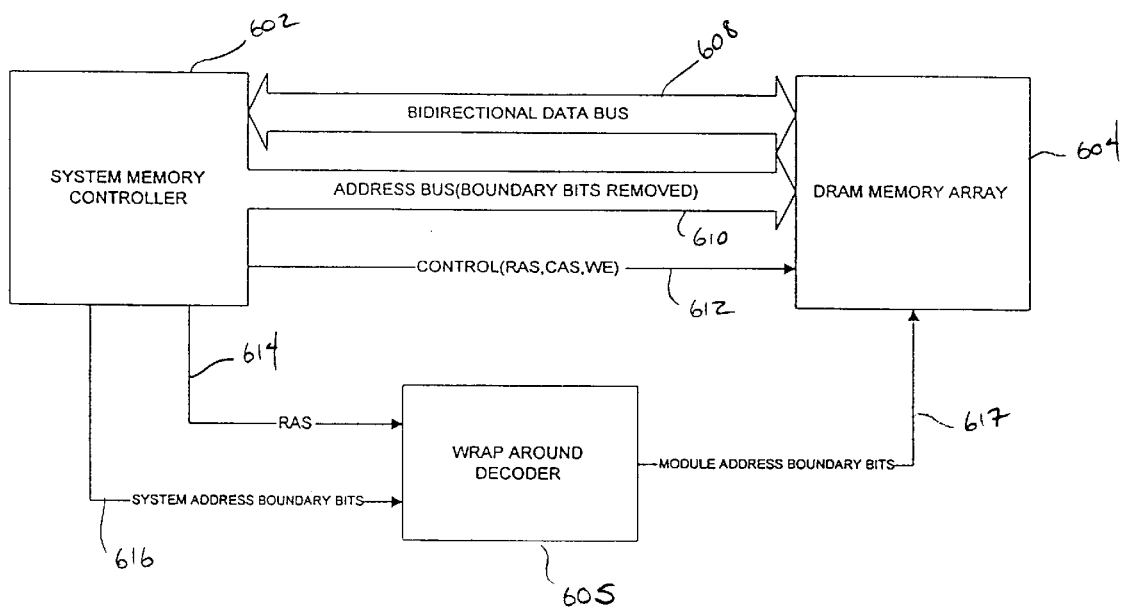
FIG. 6 is a block diagram of a system using a decoder in connection with memory addressing operations between the memory controller and the memory array.

FIG. 6 is a block diagram of a memory controller 602 and a memory array 604 connected by a bidirectional data bus 608, and an address bus 610. Control lines 612 also connect the memory controller 602 with the memory array 604. Also shown in FIG. 6 is a decoder 605, which is used to decode and modify some of the signals for the memory array 604. In the embodiment of FIG. 6, the address bus 610 carries address lines A0 to A9. The remaining address line, A10, is passed to the decoder 605 over the connection (or bus) 616.

The purpose of the decoder 605 shown in FIG. 6 is to mask out the defective memory cells in the memory array 604 so the memory controller uses only non-defective portions of the memory array 604. The decoder 605 modifies the address bit A10 on connection 616 to ensure that the memory controller accesses a non-defective memory cell. The modified address bit A10 is then passed to the memory array 604 over connection 617. Although for purposes of illustration the decoder 605 is shown separate from the memory controller, it should be understood that the decoder 605 could be integrated into the memory controller 602, or into another device within the system.

Figure 7:
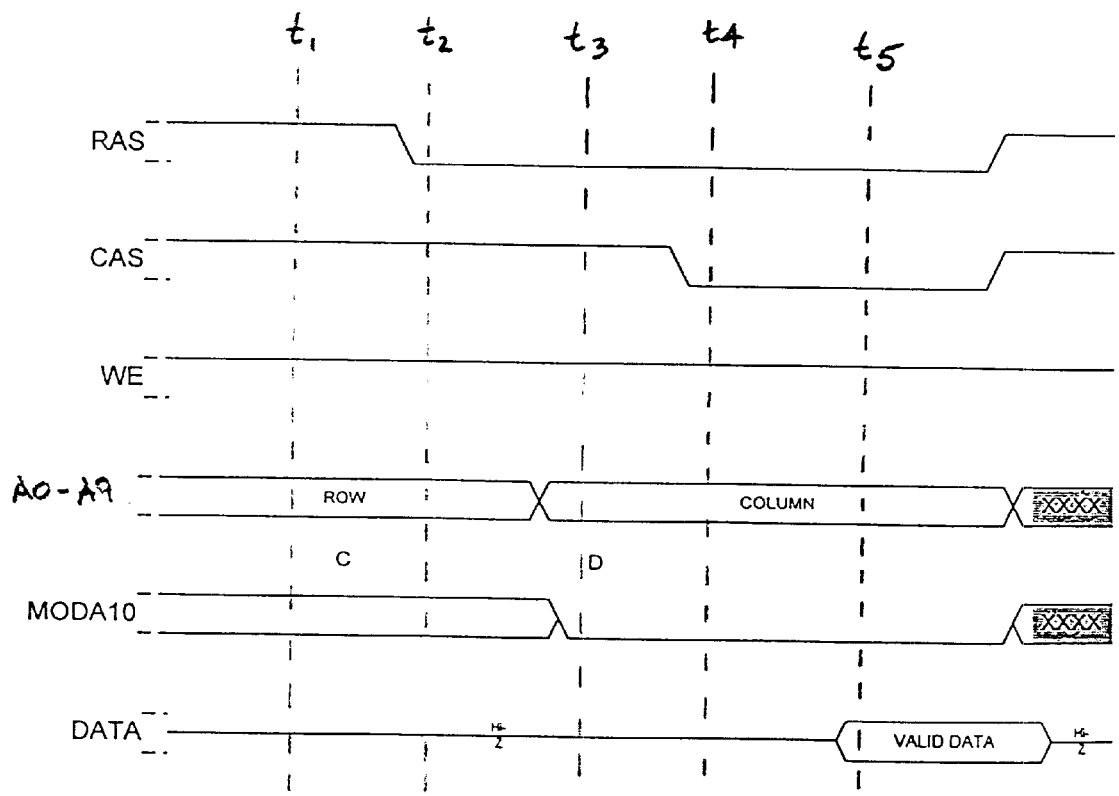
FIG. 7 is a timing diagram of a memory read cycle in the system of FIG. 6.

FIG. 7 is a timing diagram that illustrates a memory read cycle in the system of FIG. 6, where the memory array being read from is defective as shown in FIG. 5. At t1 in FIG. 7, the first ten bits of the row address A0 to A9 are received from the memory controller and placed on the address bus 610. The eleventh bit, A10, has been passed to the decoder 605 over connection 616, and then passed unchanged to the memory array 604 on connection 617 (MODA10 in FIG. 7). Because the eleventh row bit is passed through unchanged, all 2048 rows are accessible. At time t2, the row address strobe (RAS) is activated, thereby strobing the full eleven bit row address (i.e., on lines 612 and 617) into the memory array 604.

By time t3, the ten column bits of the column address have been placed on lines A0 to A9 on bus 610. The memory array appears to the memory controller to be a memory array of size 2048×1024, addressable with an eleven bit row address and a ten bit column address. Therefore, the memory controller does not provide an eleventh column address bit. The line A10 is forced low by the decoder 605 and passed through the memory array on line 617 as MODA10. Thus, regardless of the column address generated by the memory controller 602, the decoder 605 ensures that only the first 1024 columns are addressable, thereby hiding region B in FIG. 5. In this manner, the decoder 605 effectively hides the region B in FIG. 5, and makes a partially defective memory array appear to the memory controller 602 to be a smaller, but non-defective memory array. At some time after the column address strobe (CAS) is activated at time t4, the data being read from the addressed location in the memory array 604 becomes valid at t5.

Figure 8:
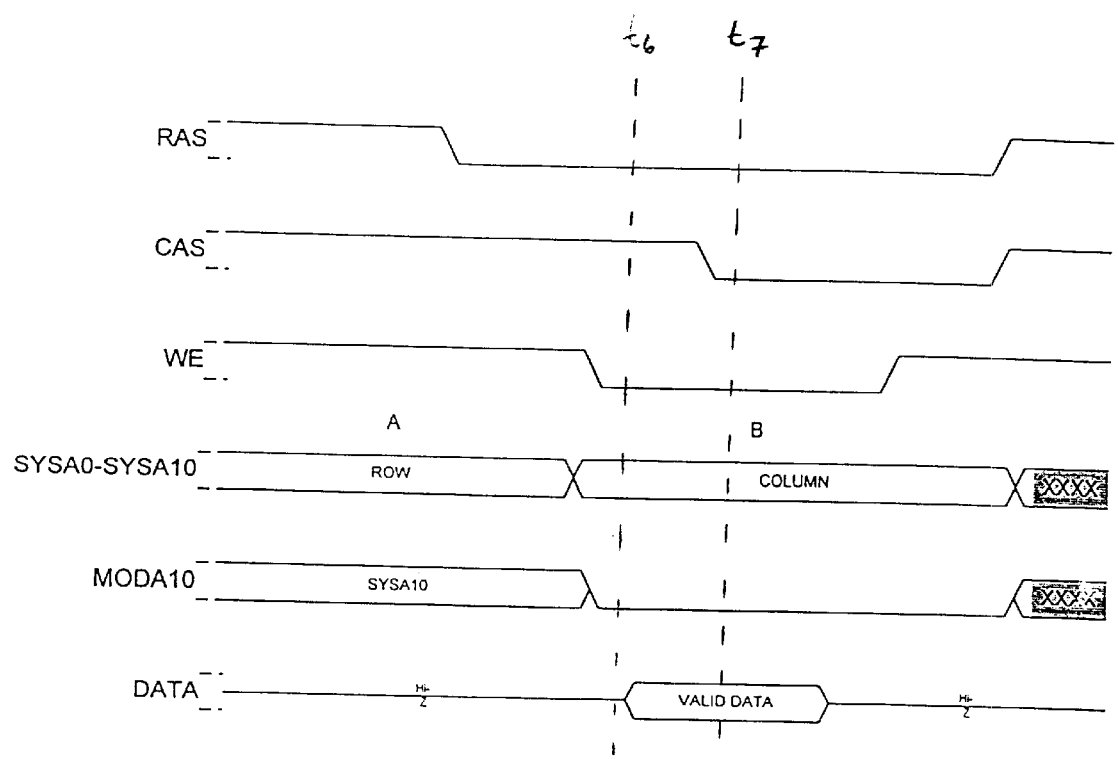
FIG. 8 is a timing diagram of a memory write cycle in the system of FIG. 6.

FIG. 8 is a timing diagram illustrating a write operation in the system of FIGS. 5 and 6. As can be seen from FIG. 8, the addressing procedure and the operation of the decoder 605 are the same as that of FIG. 7. The decoder 605 forces the most significant column address bit low, and ensures that only the first 1024 columns are addressable. The write enable (WE) control signal is activated at time t6 in FIG. 8, and the data that is on the data bus 608 is written into the addressed location at time t7. As in FIG. 7, the 2048×2048 memory array of FIG. 5 appears to be a 2048×1024 memory array.

Figure 9:
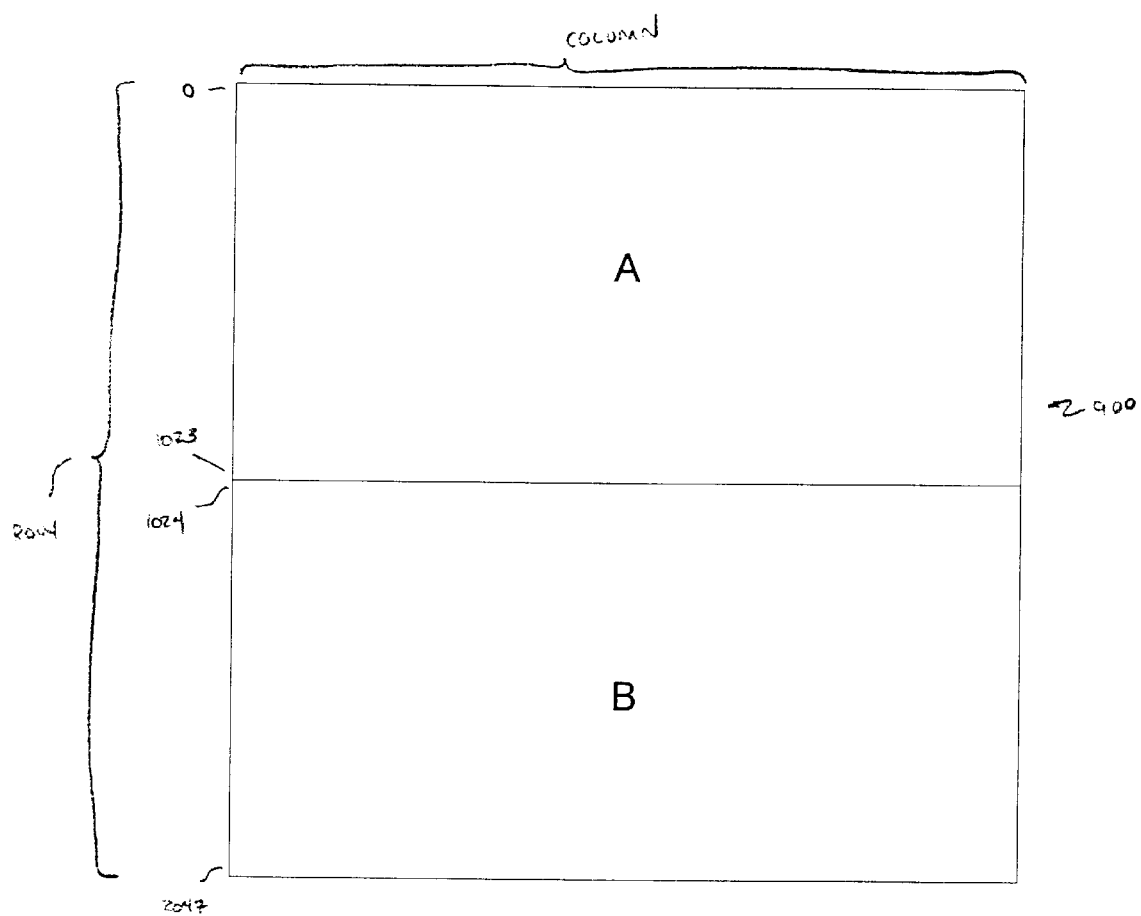
FIG. 9 is a representation of a memory array having a defective portion and a non-defective portion divided at a row address boundary.

FIG. 9 illustrates a row and column addressable memory array 900 of size 2048×2048, similar to those shown in FIGS. 2 and 5. In the array shown in FIG. 9, the cells within region A in the memory array (rows 0 to 1023 for all columns) are not defective, and provide reliable data. However, at least some of the memory cells within region B (rows 1024 to 2047 for all columns) are defective, and cannot be relied upon for valid and accurate data. At least some of the cells within region B in FIG. 9 are unusable.

The unusable cells shown in FIG. 9 within region B fall on one side of a row address boundary. When the most significant row address bit is high (see bit 304 in FIG. 3), the addressed memory cell falls within region B of FIG. 9. When the most significant row address bit is low, the addressed memory cell falls within region A of FIG. 9. Thus, for the memory map of FIG. 9, the state of the most significant row address bit determines whether the addressed memory cell is within region A or region B. The memory array corresponding to the memory map of FIG. 9 can therefore be treated as a 1024×2048 memory array, addressable with a ten bit row address and eleven bit column address.

Referring again to FIG. 6, a modified version of the decoder 605 again can be used to mask out the defective memory cells in the memory array 604 where the defective memory array 604 has defects that follow the pattern of FIG. 9. To hide the defective memory cells, the decoder 605 this time modifies the row address bit on A10 to ensure that the memory controller always accesses a non-defective memory cell.

Figure 10:
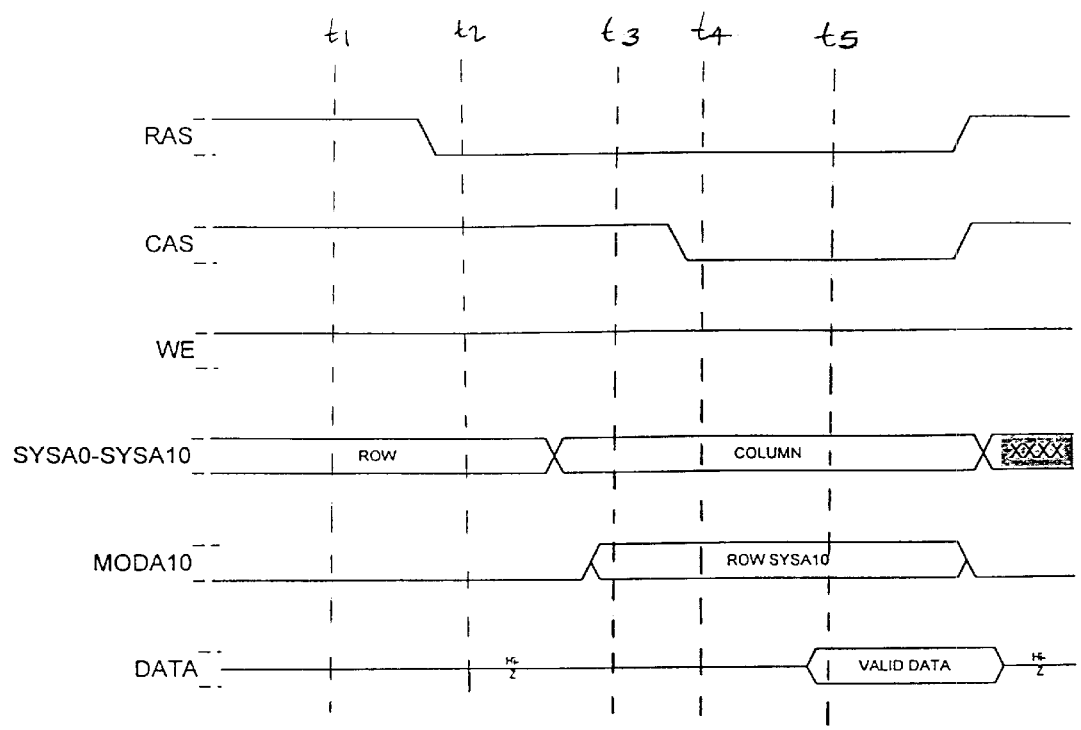
FIG. 10 is a timing diagram of a memory read cycle for a system having the partially-defective memory array shown in FIG. 9.

For example, FIG. 10 is a timing diagram of a memory read cycle in the system of FIG. 6, where the memory array being read from is defective as shown in FIG. 9. The memory controller in this embodiment is configured to use an 11 bit row address and a ten bit column address, even though the memory array is treated as a 1024×2048 memory array. At t1 in FIG. 10, the first ten bits of the row address A0 to A9 are placed on the address bus 610. The eleventh bit, A10, is passed to the decoder 605 over connection 616, and is stored for use when the column address is presented. Line 617 (MODA10 in FIG. 10), which corresponds to the eleventh row bit input on the memory array 604, is driven low by the decoder 605. Thus, regardless of the row address generated by the memory controller 602, the decoder 605 ensures that only the first 1024 rows are addressable. The row address strobe (RAS) is asserted at time t2.

At time t3, the memory controller places the ten column address bits on the bus 610, and the stored eleventh row bit is placed on the line MODA10, thereby presenting an eleven bit column address to the memory array. At some time after the column address strobe (CAS) is activated at time t4, the data being read from the addressed location becomes valid at t5. Because eleven column bits are presented to the memory array 604, all 2048 columns are accessible, although only the first 1024 rows are accessible. The decoder 605 effectively hides the region B in FIG. 9, and makes a partially defective memory array appear to the memory controller 602 to be a smaller, but nondefective 1024×2048 memory array, which is the size of region A.

Figure 11:
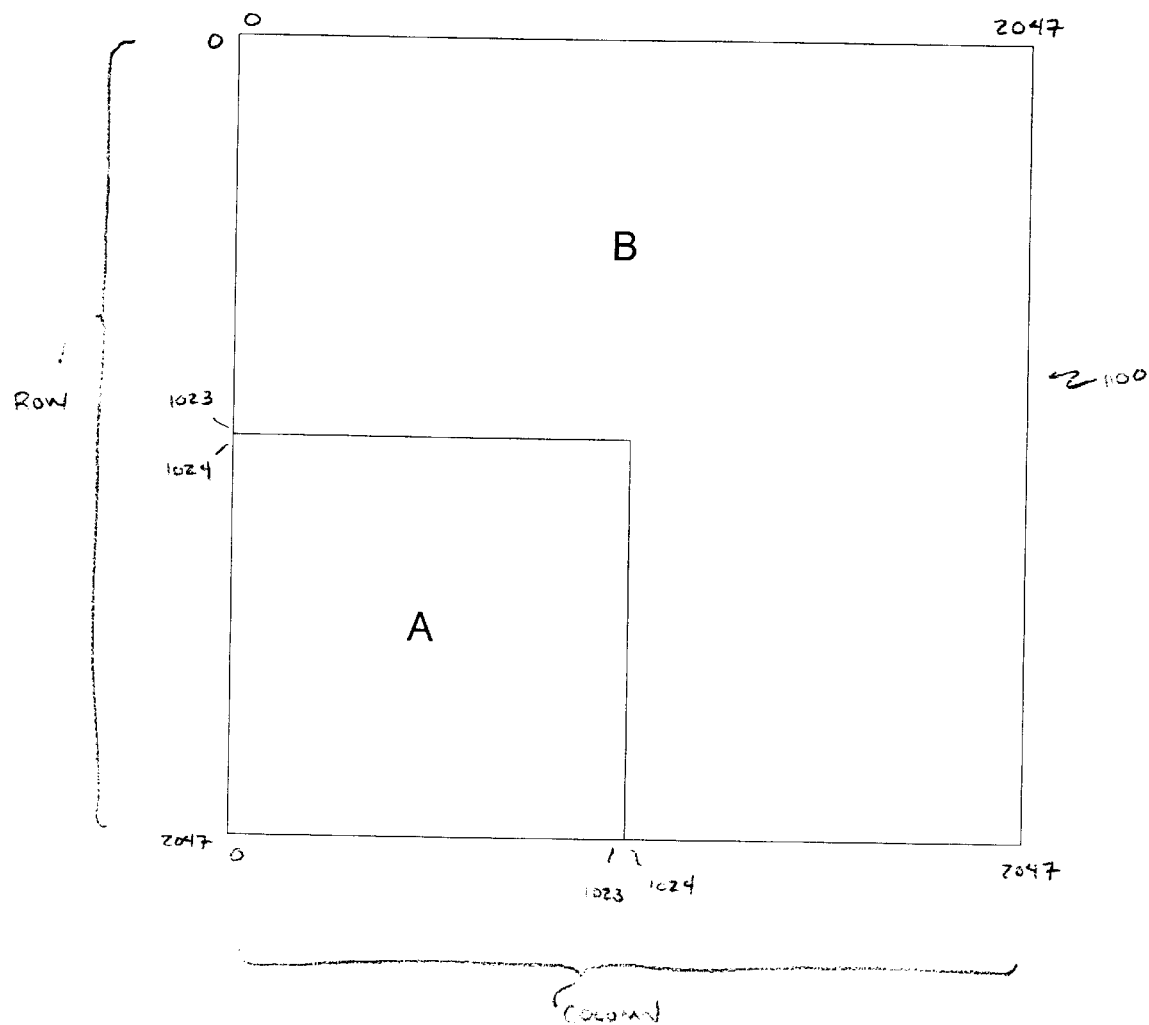
FIG. 11 is a representation of a memory array having a defective portion and a non-defective portion divided at both a row and column address boundary.

FIG. 11 illustrates another row and column addressable memory array 1100 of size 2048×2048, similar to those shown in FIGS. 2, 5, and 9. In the array shown in FIG. 11, the cells within region A in the memory array (rows 1024 to 2047 for columns 0 to 1023) are not defective, and provide reliable data. However, at least some of the remaining memory cells (those within region B) are defective, and cannot be relied upon for valid and accurate data. At least some of the cells within region B in FIG. 11 are thus unusable.

The unusable cells shown in FIG. 11 within region B fall on one side of both a row and column address boundary. When the most significant row address bit is low (see bit 304 in FIG. 3), or if the most significant column address is high (see bit 302 in FIG. 3), the addressed memory cell falls within region B of FIG. 11. When both the most significant row address bit is high and the most significant column address is low, the addressed memory cell falls within region A of FIG. 11. Thus, the most significant row and column address bits determine whether the addressed location falls within region A or region B. Where a multiplexed addressing procedure is used, these bits will be passed to the memory array on the same address line, A10.

Referring again to FIG. 6, another version of the decoder 605 is used to mask out the defective memory cells in the memory array 604 where the defective memory array 604 has defects that follow the pattern of FIG. 11. To hide the defective memory cells, the decoder 605 modifies both the row and column address bit on A10 to ensure that the memory controller always accesses a non-defective memory cell. This makes the memory array appear to be a 1024×1024 memory array, addressable with a ten bit row address, and a ten bit column address.

Figure 12:
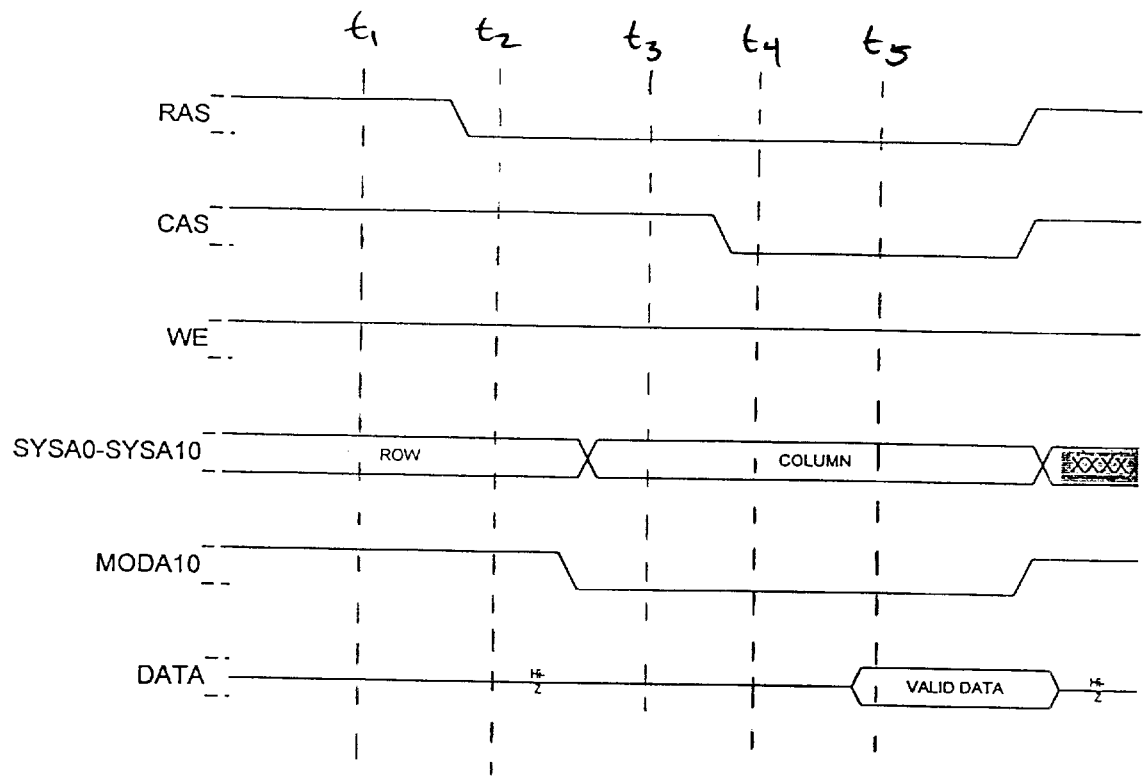
FIG. 12 is a timing diagram of a memory read cycle for a system having the partially-defective memory array shown in FIG. 11.

FIG. 12 is a timing diagram illustrating a memory read cycle in the system of FIG. 6, where the memory array being read from is defective as shown in FIG. 11. At t1 in FIG. 10, the ten row bits of the row address A0 to A9 are placed on the address bus 610. The memory controller does not provide an eleventh bit, A10, so the line 617 is forced high by the decoder 605. The decoder 605 thus ensures that only the first 1024 rows are addressable. The row address strobe (RAS) is asserted at time t2.

At time t3, the ten column bits of the column address have been placed on lines A0 and A9 of bus 610. Again, there is no eleventh column address bit, so the line 617 is forced low by the decoder 605 and passed through to the memory array on connection 617, ensuring that only the first 1024 rows are addressable. At some time after the column address strobe (CAS) is activated at time t4, the data being read from the addressed location becomes valid at t5. The decoder 605 thus effectively hides the region B in FIG. 12, and makes a partially defective memory array appear to the memory controller 602 to be a non-defective memory array of the size of region A.

Figure 13:
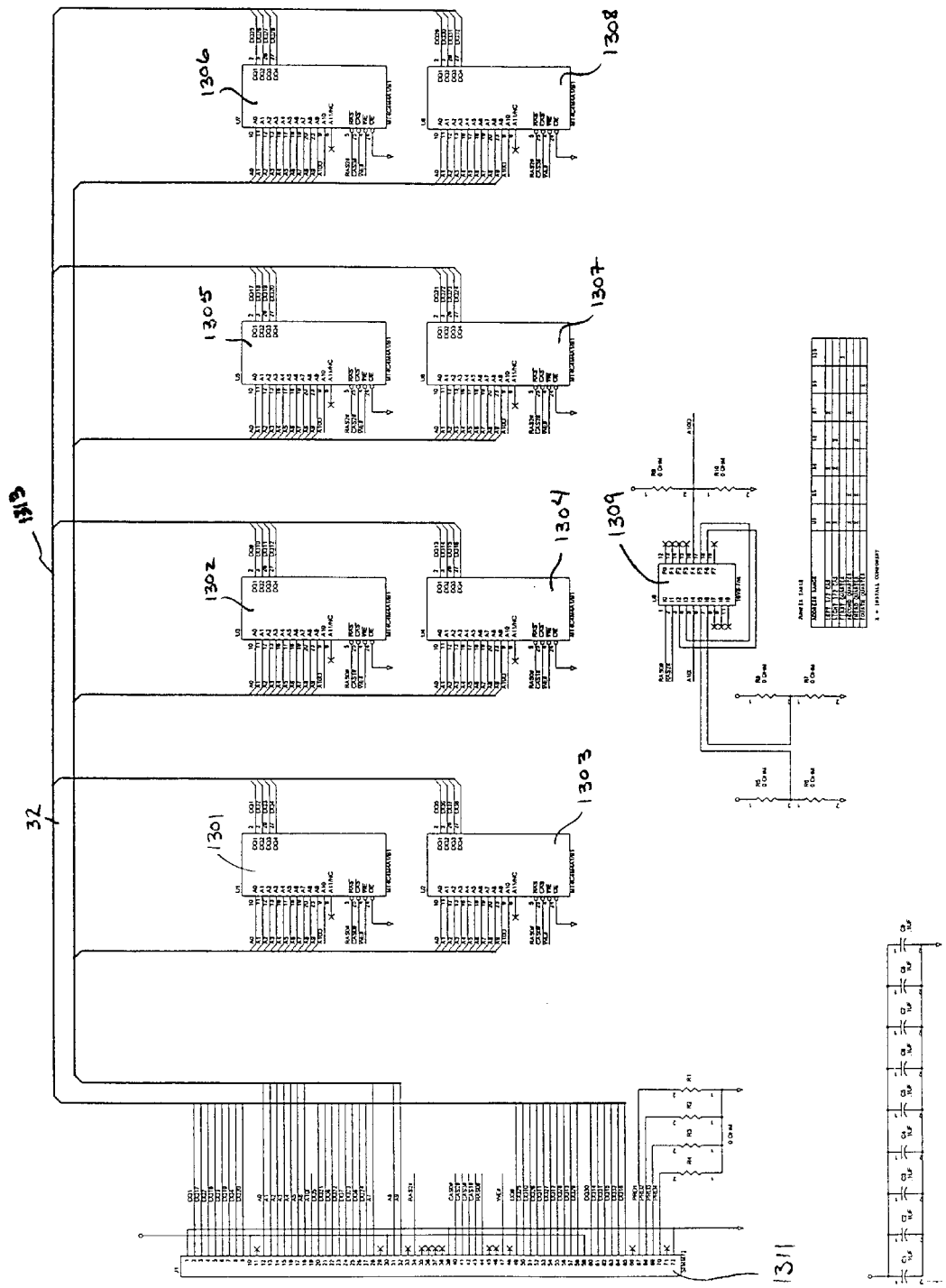
FIG. 13 is a block diagram of a memory array made up of eight partially defective components to make a 32-bit non-defective memory array.

FIG. 13 is a schematic diagram of a memory module in one embodiment of the present invention, where eight partially defective RAM components 1301–1308 are combined to create a non-defective memory array. Each component 1301 to 1308 constitutes a memory array that is 2048×2048, having a data width of 4 bits. When the components 1301 to 1308 are aggregated, they make up a memory array of 2048×2048, with a data width of 32 bits.

Logic 1309 acts as the decoder, which generates a modified A10 signal, thereby hiding a defective portion of the memory array, and making the memory array appear to be a smaller, but non-defective memory array. Thus, the memory array acts as a memory array that is smaller than 2048×2048. The modified A10 signal is used as an input to each of the components 1301–1308. The four outputs from each of the eight components are combined to create a 32 bit data bus, which communicates with edge connector 1311 over bus 1313.

Although the present invention has been shown and described with respect to preferred embodiments, various changes and modifications, even if not shown or specifically described herein, are deemed to lie within the spirit and scope of the invention and the following claims. For example, although the present invention has been described as modifying the most significant row and/or column address bits, the present invention may encompass embodiments where other bits are modified, or where more than one bit or address line is modified. Accordingly, it is the appended claims, and not the foregoing illustrations and descriptions that define the scope of the invention.

What is claimed is:

1. A computer comprising:
   (a) a processor;
   (b) a memory controller connected to the processor by a host bus, wherein the memory controller generates an address;
   (c) a memory module that is accessible to the memory controller through an address bus, wherein the memory module includes a selected region having defective and non-defective cells; and
   (d) a decoder comprising:
      inputs that receive at least a portion of the address from the memory controller; and
      logic which modifies said received portion of said address so that the selected region of the memory module is not accessed, and which places at least a portion of the modified address on the address bus.

2. The computer of claim 1, wherein the memory module is addressed through a multiplexed address that includes a row address and a column address.

3. The computer of claim 2, wherein the logic that modifies the address comprises logic that modifies a portion of the row address.

4. The computer of claim 3, wherein the logic that modifies a portion of the row address modifies a higher order bit in the row address.

5. The computer of claim 2, wherein the logic that modifies the address comprises logic that modifies a portion of the column address.

6. The computer of claim 5, wherein the logic that modifies a portion of the column address modifies a higher order bit in the column address.

7. The computer of claim 6, wherein the logic that modifies the address comprises logic that modifies a portion of the row address.

8. The computer of claim 7, wherein the logic that modifies a portion of the row address modifies a higher order bit in the row address.

9. The computer of claim 8, wherein the modified portion of the row address and the modified portion of the column address share at least one line on the address bus.

10. The computer of claim 9, wherein the memory controller includes:
    logic that strobes the row address and the column address to the memory module.

11. The computer of claim 10, wherein the memory controller further includes: logic that toggles the column address to enable a burst mode for the memory module when an operation involving the memory module is being carried out.

12. The computer of claim 1 further comprising a first line directly connecting the memory controller to the decoder such that said at least a portion of the address is communicated from the memory controller to the decoder via said first line.

13. The computer of claim 12 further comprising a second line directly connecting the decoder to the address bus such that said at least a portion of the modified address is communicated from the decoder to the address bus via said line.

14. A memory controller that accesses a memory module over an address bus, wherein the memory module has a selected region which includes both defective and non-defective cells, the memory controller comprising:
    (a) inputs for receiving an address from a processor over a host bus;
    (b) address outputs connected to the address bus;
    (c) logic that modifies the address received from the processor without reference to defects of the location identified by the received address, so that the selected region of the memory module is not accessed; and
    (d) logic that places the modified address at the address outputs.

15. The memory controller of claim 14, further comprising:
    (e) logic that divides the address received from the processor over the host bus into a row address and a column address.

16. The memory controller of claim 15, further comprising:
    (f) logic that presents the address to the memory module by first presenting the row address to the memory module by placing it at the address outputs, and then presenting the row address to the memory module by placing it at the address outputs.

17. The memory controller of claim 16, wherein the logic that modifies the address comprises logic that modifies a portion of the row address.

18. The memory controller of claim 17, wherein the logic that modifies a portion of the row address modifies a higher order bit in the row address.

19. The memory controller of claim 16, wherein the logic that modifies the address comprises logic that modifies a portion of the column address.

20. The memory controller of claim 19, wherein the logic that modifies a portion of the column address modifies a higher order bit in the column address.

21. The memory controller of claim 20, wherein the logic that modifies the address further comprises logic that modifies a portion of the row address.

22. The memory controller of claim 21, wherein the logic that modifies a portion of the row address modifies a higher order bit in the row address.

23. The computer of claim 22, wherein the modified portion of the row address and the modified portion of the column address share at least one line on the address bus.

24. The memory controller of claim 23, further comprising:
    logic that strobes the row address and the column address to the memory module.

25. The memory controller of claim 24, further comprising:
    logic that toggles the column address to enable a burst mode for the memory module when an operation involving the memory module is being carried out.

26. A computer comprising:
    (a) a processor;
    (b) a memory module that is accessible over an address bus, and that includes a selected region having defective and non-defective cells; and
    (c) means for receiving a memory module address from the processor and modifying said address without reference to defects of the location identified by the received address, to preclude access to the selected region of the memory module.

27. The computer of claim 26, further comprising:
(d) means for carrying out an operation involving the memory module.

28. The computer of claim 27, further comprising:
(e) means for addressing the memory module through a multiplexed address that includes a row address and a column address.

29. The computer of claim 28, further comprising:
(f) means for modifying a higher order bit in the multiplexed address.

30. The computer of claim 29, further comprising:
(g) means for strobing the row address and the column address to the memory module.

31. The computer of claim 30, further comprising:
(h) means for toggling the column address to enable a burst mode for the memory module when an operation involving the memory module is being carried out.

32. A memory controller that accesses a memory module over an address bus, wherein the memory module has a region which includes both defective and non-defective cells, the memory controller comprising:
(a) inputs for receiving an address from a processor over a host bus;
(b) address outputs connected to the address bus;
(c) logic that converts the address into a row address and a column address;
(d) logic that modifies a higher order bit in at least one of the row and column addresses, without reference to defects of the location identified by the received address, such that the region that includes both defective and non-defective cells is not addressed by the row address and column address; and
(e) logic that places the modified address at the address outputs.

33. A system for performing an operation on memory of a first size, having defective memory cells, comprising:
means for identifying a region of the memory which includes defective memory cells; and
means for providing a signal defining a higher order bit in an address of a location in the memory, such that said signal precludes access to the identified region; wherein the memory appears to a memory controller as being of a second size which is smaller than the first size.

34. A memory controller that accesses a memory module over an address bus, wherein the memory module has a selected region which includes both defective and non-defective cells, the memory controller comprising:
(a) inputs for receiving an address from a processor over a host bus;
(b) address outputs connected to the address bus;
(c) logic for providing a signal defining a higher order bit in an address of a location in the memory, such that said signal precludes access to the identified region, wherein the memory appears to a memory controller as being of a second size which is smaller than the first size; and
(d) logic that places the modified address at the address outputs.

* * * * *